(12) United States Patent
Abarra et al.

(10) Patent No.: US 9,437,404 B2
(45) Date of Patent: Sep. 6, 2016

(54) SPUTTERING APPARATUS

(71) Applicant: Seagate Technology LLC, Cupertino, CA (US)

(72) Inventors: Noel Abarra, Fuchu (JP); Tetsuya Endo, Fuchu (JP)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 13/889,538

(22) Filed: May 8, 2013

(65) Prior Publication Data

US 2013/0299345 A1    Nov. 14, 2013

(30) Foreign Application Priority Data

May 9, 2012  (JP) ................................ 2012-107773
Mar. 27, 2013  (JP) ................................ 2013-065989

(51) Int. Cl.
*H01J 37/34* (2006.01)
*C23C 14/35* (2006.01)
(Continued)

(52) U.S. Cl.
CPC ......... *H01J 37/3417* (2013.01); *C23C 14/225* (2013.01); *C23C 14/35* (2013.01); *C23C 14/352* (2013.01); *H01J 37/3405* (2013.01); *H01J 37/3411* (2013.01); *H01J 37/3414* (2013.01); *H01J 37/3435* (2013.01); *H01J 37/3447* (2013.01); *H01J 37/3455* (2013.01); *C23C 14/042* (2013.01); *C23C 14/044* (2013.01)

(58) Field of Classification Search
CPC ... C23C 14/042; C23C 14/225; C23C 14/16; C23C 14/044; C23C 14/352; H01J 37/3411; H01J 37/3414; H01J 37/3417; H01J 37/3435; H01J 37/3447; H01J 37/3405; H01J 37/3455

USPC ........... 204/298.11, 298.12, 298.16, 298.17, 204/298.23
See application file for complete search history.

(56) References Cited

U.S. PATENT DOCUMENTS 3,756,939 A * 9/1973 Hurwiit ..................... 204/298.12
5,292,419 A * 3/1994 Moses et al. ............. 204/298.28
6,328,858 B1 * 12/2001 Felsenthal et al. ...... 204/192.15
(Continued)

FOREIGN PATENT DOCUMENTS

JP    S63-11559 U    1/1988
JP    H03-202466 A    9/1991
(Continued)

OTHER PUBLICATIONS

D. Z. Bai et al., "Writer Pole Tip Remanence in Perpendicular Recording", IEEE Transactions on Magnetics, vol. 42, No. 3, pp. 473-480, Mar. 2006.
(Continued)

*Primary Examiner* — Michael Band
(74) *Attorney, Agent, or Firm* — Kagan Binder, PLLC

(57) ABSTRACT

A sputtering apparatus is provided with an elongated target holder, a substrate holder having a substrate receiving surface, and a mask assembly having an opening configured between the target holder and the substrate holder. The mask assembly is comprised of a first and second masking part having facing edges that form the opening and are disposed parallel to the substrate receiving surface and independently movable in a direction perpendicular to the length of the target holder and parallel to the substrate receiving surface, or in a direction perpendicular to the substrate receiving surface.

17 Claims, 14 Drawing Sheets

(51) Int. Cl.
  *C23C 14/04* (2006.01)
  *C23C 14/22* (2006.01)

(56) References Cited

U.S. PATENT DOCUMENTS

| | | | |
|---|---|---|---|
| 6,800,183 B2* | 10/2004 | Takahashi | 204/298.28 |
| 6,899,795 B1* | 5/2005 | Dubs et al. | 204/192.12 |
| 7,033,461 B2* | 4/2006 | Tani et al. | 204/192.13 |
| 7,879,201 B2* | 2/2011 | Druz et al. | 204/192.11 |
| 2002/0046945 A1 | 4/2002 | Hosokawa et al. | |
| 2003/0085122 A1 | 5/2003 | Takahashi | |
| 2005/0034979 A1 | 2/2005 | Druz et al. | |
| 2005/0115822 A1* | 6/2005 | Maass et al. | 204/192.2 |
| 2006/0054494 A1* | 3/2006 | Reiss | 204/192.12 |
| 2007/0095651 A1* | 5/2007 | Ye et al. | 204/192.1 |
| 2010/0155229 A1 | 6/2010 | Endo et al. | |
| 2010/0187095 A1 | 7/2010 | Aoki et al. | |
| 2011/0024284 A1* | 2/2011 | Schloremberg et al. | 204/192.12 |

FOREIGN PATENT DOCUMENTS

| | | |
|---|---|---|
| JP | H10036963 | 2/1998 |
| JP | 2001192805 | 7/2001 |
| JP | 2002-076472 A | 3/2002 |
| JP | 2002088470 A  * | 3/2002 |
| JP | 2003-147519 A | 5/2003 |
| JP | 2005-526179 A | 9/2005 |
| JP | 2006-089793 A | 4/2006 |
| JP | 2007-231303 A | 9/2007 |
| JP | 4352104 B1 | 10/2009 |
| JP | 2010174331 | 8/2010 |
| JP | 2010539674 | 12/2010 |
| WO | 2009039261 | 3/2009 |
| WO | 2010/073307 A1 | 7/2010 |

OTHER PUBLICATIONS

Japanese Office Action dated Jul. 28, 2015 (mailing date), issued in counterpart Japanese Patent Application No. 2013-065989 with English translation.

* cited by examiner

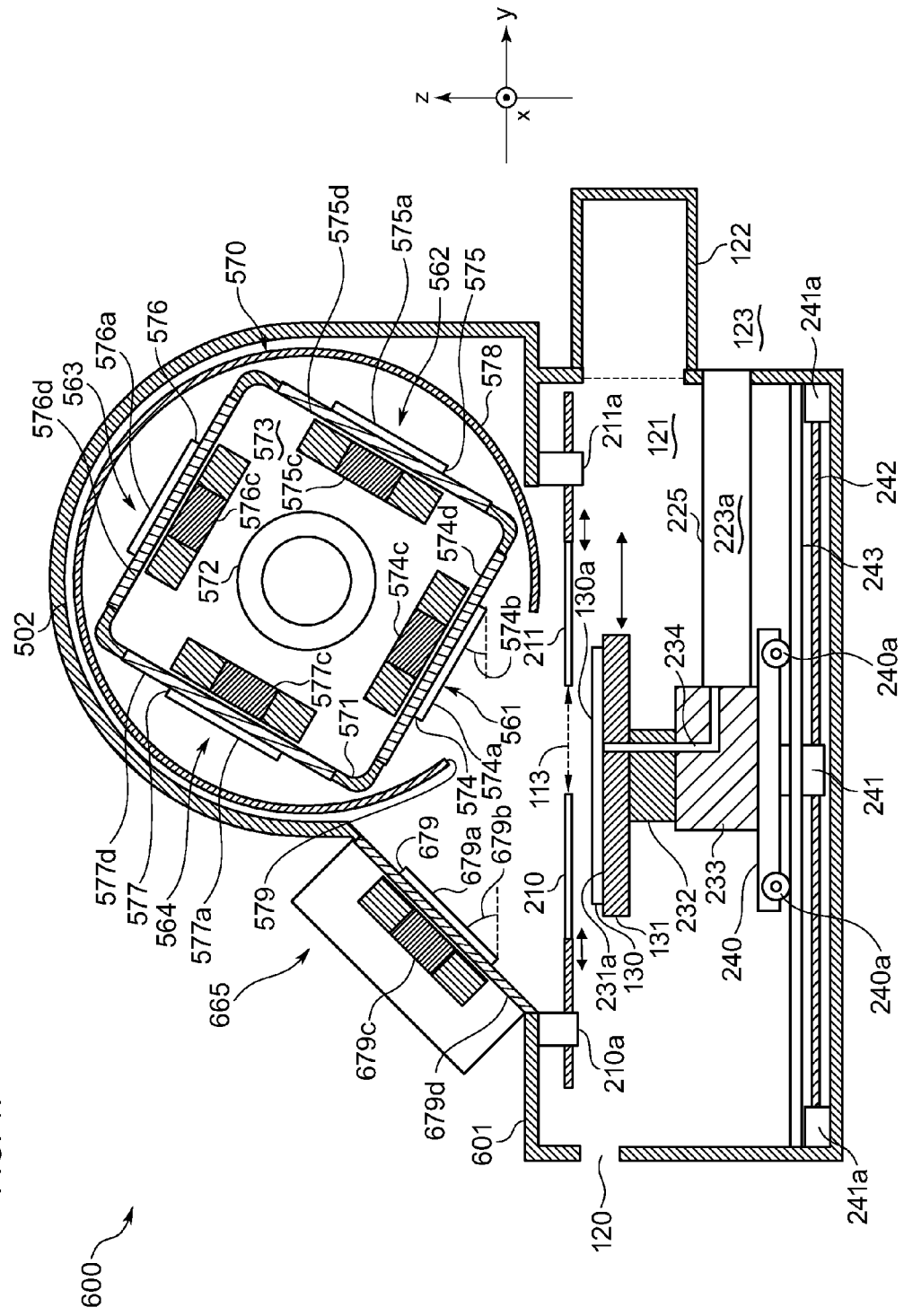

SPUTTERING APPARATUS

BACKGROUND OF THE INVENTION

1. Field of the Invention

The present invention relates to a sputtering apparatus, and more particularly, to an apparatus for forming a magnetic layer.

2. Description of the Related Art

A magnetic hard disk drive (HDD) includes a magnetic disk medium having high coercivity polycrystalline magnetic films thereon and at least a transducer (magnetic head). The transducer includes a magneto-resistive read sensor which reads data from the disk medium and a high magnetic moment writer which writes data on the disk medium.

The writer is a patterned thick magnetic film. Alloys of Fe—Co are typically employed due to their large magnetic saturation (magnetic moment) as the magnetic layer in the writer.

Transducers employed in HDDs are fabricated on 5 to 8 inch diameter wafers made of $Al_2O_3$—TiC. A single wafer is cut to give rise to several tens of thousands of transducers. Therefore, uniformity and "low skew" over an entire wafer are very important as they determine the yield. Here, low skew means that the deviation of the direction of magnetic easy axes on a wafer from a predetermined direction is small, i.e., the easy axes are well aligned.

A read sensor is typically made of multiple layers of very thin films, several of which are made of soft magnetic material such as Fe—Co—B and Ni—Fe alloys separated by a nonmagnetic spacer such as Cu or MgO. In read sensors similar to writer films, it is preferred that each easy axis is aligned along a predetermined direction. For both writers and readers, the easy axis alignment is preferably made during deposition, as the effect of relatively low temperature (<300° C.) post annealing is modest, especially in the case of Fe—Co films.

Alignment of the easy axis is usually made by applying an external field to the film while the film is being formed. The external field promotes pair-ordering anisotropy. Therefore, in a sputtering process, a separate magnetic field source is employed so as to expose the substrate surface to parallel fields. The fields may have a small component normal to the substrate surface but are preferably predominantly parallel to the surface plane. For example, when Fe-rich Fe—Co is deposited at near normal deposition angles with no substrate field, an in-plane isotropic film is obtained. The coercivity in any direction on the film plane is essentially constant.

By applying an external field during deposition, uniaxial anisotropy is induced. For example, the coercivity may be ≥25 Oe in the substrate field direction (easy axis) and <1 Oe in the perpendicular direction (hard axis). However, it is difficult to apply parallel substrate magnetic fields in a sputtering apparatus having cathodes with circular or rotating magnetrons, because such magnetrons emit fields that may interfere with the substrate magnetic fields. Moreover, the substrate fields adversely affect film uniformity. The distance between the target and the substrate may be increased to improve film uniformity, but the improvement comes at the expense of significant reduction in deposition rates.

Oblique deposition is also known to promote uniaxial anisotropy in Fe—Co films. For technologically important Permalloy ($Ni_{81}Fe_{19}$) and high saturation magnetization Ms (e.g. $Fe_{70}Co_{30}$) films, the easy axis direction changes by 90 degrees at an incidence angle of 45 degrees. For modest incidence angles<45 degrees, the induced easy axis is in the plane of the incidence. Here, incidence angle is defined as an angle between a substrate normal axis and an incidence direction of sputtered particles. For angles greater than 45 degrees, the easy axis is transverse or perpendicular to the plane of incidence. Oblique deposition gives rise to films with anisotropy strength significantly higher than those deposited at near normal angles in the presence of an aligning magnetic field. This is true for a large class of magnetic materials such as Co, Fe, Ni—Fe, Fe—Co, and Fe—Co—B. Very high anisotropy values can be obtained especially at an incidence angle of 70 to 80 degrees. The induced anisotropy is attributed to anisotropic stress or shape anisotropy due to shadowing during deposition. However, obliquely deposited films exhibit reduced density and saturation magnetization density. Modest oblique angle deposition can only be applied when high saturated magnetization density is required.

Forming an undercoat layer with relatively thick seed layers (up to 5 nm) deposited by oblique deposition can result in large Hk for magnetic layers subsequently deposited on the seed layers. Accordingly, both high Hk and density can be achieved for the magnetic layer. Moreover, at modest magnetic layer deposition incidence angles that maintain the saturated magnetization density (<40 degrees for $Fe_{70}Co_{30}$), even without the benefit of an obliquely deposited seed layer, higher anisotropy strength is obtained compared to near normal incidence deposition in the presence of an aligning field. Oblique deposition is therefore a good candidate for fabricating write-pole films with large Hk.

For applications that do not need the maximum 2.4 T magnetization, such as sensors, higher angles may be employed to access higher Hk values. The Hk dependence with incidence angle is steep at high angles. Therefore, both the incidence angle and its distribution must be controlled to obtain large area films with uniform magnetic properties.

Oblique deposition is also effective for applications that require anisotropic stress. For example, techniques that utilize non-magnetic compression layers to improve self-pinning of one of the magnetic layers of a sensor rely on a cut to transform the isotropic stress into an anisotropic compressive stress perpendicular to the direction of the cut. The stress anisotropy can further be increased by oblique deposition of the compressive layers.

Fe—Co alloys exhibit larger easy axis coercivities than Ni—Fe films. Furthermore, for technologically important high saturation magnetization, Fe-rich Fe—Co alloys, the magnetic anisotropy (and easy axis coercivity) may typically increase with thickness. This is mainly due to grain size increasing with thickness. For sensors, the magnetic films employed are very thin (<5 nm) whereas for write-poles, the films may be thicker than 200 nm. A method to mitigate grain size growth, such as by seed layer deposition and adatom mobility reduction during film formation is therefore advantageous particularly for write-pole film deposition. It is known that Cu, Ni—Fe, or Ru seed layers are effective for grain size reduction in Fe—Co films. To suppress grain coarsening by increasing layer thickness, substrate cooling may be made available.

JP 2005-526179 A discloses a method and an apparatus for depositing magnetic films in the presence of a magnetic field from a physically fixed substrate field source. With a large rectangular target and a smaller round substrate, portions of a cathode magnetron are located far from the substrate such that the stray magnetic fields from the cathode magnet may not to interfere with the substrate magnetic fields. The part of the cathode magnetron that is closer to the substrate has stray fields that are substantially parallel to the field generated by the substrate field source. The substrate or wafer to be processed is translated under the target parallel to the substrate fields and perpendicular to the target length. Intrinsic to the linear translation method, every segment parallel to the target length of a passing substrate surface receives the same flux of incoming sputtered particles. Excellent film thickness uniformity along the translation direction can be expected. And for sufficiently long targets, this arrangement also results in films with good transverse film uniformity and low skew values. Very high deposition rates are accessible and lower rates can be achieved by increasing the substrate translation speed.

JP 2005-526179 A discloses a method for translating a substrate perpendicular to the long side of the elongate target. The uniformity along translating direction can be ensured by translating a substrate along the flux of sputtered particles from the target. A sufficiently long target helps to achieve the improved uniformity along traverse direction. In long targets, in general, elongated erosion pattern can be formed. In long and parallel shaped erosion, sputtering rate is relatively uniform. For a substrate symmetrically arranged under a target, the deposition rate at the center of the substrate is highest. Typically, as for a substrate of 200 mm in diameter and the distance between the substrate and the target of 100 to 200 mm, in order to achieve the thick uniformity of 1 $\sigma$<5%, the target size should be twice of the substrate size.

Japan Patent No. 4352104 discloses an oblique sputtering apparatus which uses a rotating target, a substrate stage, and a drum shutter. The anisotropy is achieved by oblique sputtering, and low skew is achieved with no magnetic field applied parallel to the substrate. The deposition technique disclosed in Japan Patent No. 4352104 is executed by a sputtering apparatus that includes an elongated target held in a manner rotatable around a first rotational axis, a substrate held in a manner rotatable around a second rotational axis disposed in parallel with the first rotational axis, and a drum shutter which is disposed between the target and the substrate and which is rotatable around the first or second rotational axis. During deposition, the substrate and drum shutter are rotated. Sputtered particles pass through the opening of the drum shutter and are deposited on a portion of the substrate on the stage.

After the deposition of up to half of the thickness of the film to be formed is complete, with the substrate being rotated by 180 degrees around a third rotational axis perpendicular to the second rotational axis, deposition is further performed while the substrate is rotated in the opposite direction around the second rotational axis. This deposition technique can further improve the film thickness uniformity in comparison with deposition techniques in a single direction. The improved film thickness uniformity by the rotation direction is achieved by the accurate control of substrate and shutter angular velocities during deposition.

However, in JP 2005-526179 A, higher induced anisotropy by oblique sputtering is not taken advantage of. Control of sputtering incidence angle and distribution is not addressed.

Unfortunately, in the apparatus of Japan Patent No. 4352104, because the distance between the source of particles (target surface erosion area) and the deposition area on the substrate may vary during deposition, the Hk in-wafer non-uniformity can still be large. The separation between the wafer area being deposited onto and the shutter opening is also not constant. That is, the deposition geometry varies for every portion of the wafer. It is also difficult to control transverse uniformity as the shutter opening shape is fixed. The optimum shape of the opening is expected to be dissimilar for different target materials as well as process conditions such as gas pressure and cathode power.

Therefore, it is an object of the present invention to provide a sputtering apparatus for obtaining good Hk uniformity, low skew values, and good thickness uniformity to optimize deposition geometry with respect to the target and the substrate during the deposition, even when forming at various angles in order to obtain good anisotropy strength, or even when using various kinds of target materials.

SUMMARY OF THE INVENTION

According to an aspect of the present invention, there is provided a sputtering apparatus that forms a magnetic layer on a substrate, including: a vacuum enclosure; a target holder having an elongated target with a short axis and a long axis; a magnet unit provided adjacent to the target holder; a substrate holder comprising a substrate receiving surface; a translating mechanism that moves the substrate holder or the target holder along a direction substantially parallel to the substrate receiving surface and perpendicular to said elongated target long axis; and a mask assembly formed with an opening between the target holder and the substrate holder, wherein the mask assembly comprises a first masking part and a second masking part which are disposed substantially parallel to the substrate receiving surface, the opening is formed between facing edges of the first masking part and the second masking part, and the first masking part and the second masking part are independently movable in a direction substantially perpendicular to the long axis of the target and substantially parallel to the substrate receiving surface, or in a direction which is substantially perpendicular to the substrate receiving surface.

According to the present invention, a sputtering apparatus can be provided which optimizes the geometry of a target and a substrate during deposition, and thus is capable of obtaining good Hk uniformity, low skew values, and good thickness uniformity when magnetic films are deposited at various incidence angles in order to control magnetic anisotropy of the magnetic films, even if various kinds of targets are used.

BRIEF DESCRIPTION OF THE DRAWINGS

FIG. 17 is a vertical cross-sectional view showing an entire configuration of a modification of a sputtering apparatus according to the sixth embodiment of the present invention.

DETAILED DESCRIPTION OF THE PREFERRED EMBODIMENTS

With reference to the accompanying drawings, preferred embodiments of the present invention will be described below.

(1) Transducer (Magnetic Head)

Figure 1:
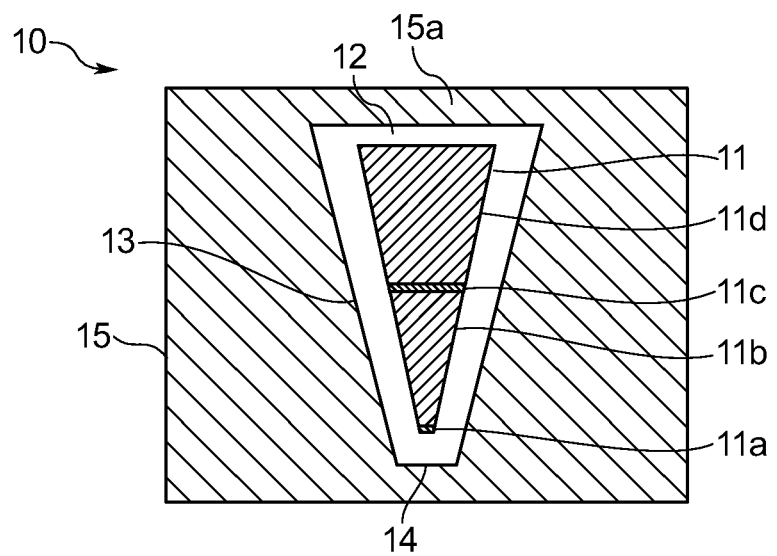
FIG. 1 is a plan view showing a configuration of a write pole of a HDD transducer.

First, a configuration of a Hard Disk Drive (HDD) transducer will be explained as an example of the application of magnetic films formed by a sputtering apparatus according to the present invention. As illustrated in FIG. 1, a writer 10 includes a magnetic write pole 11 surrounded by a side magnetic shield 15. The magnetic write pole 11 may include a seed layer 11a, a first layer 11b, a spacer layer 11c, and a second layer 11d. The first and second layers 11b, 11d are typically made of Fe—Co films with high magnetization Ms. The seed layer 11a may be made of Permalloy. The spacer layer 11c is made of Permalloy or Ru.

The magnetic write pole 11 is separated from a top portion 15a of the side magnetic shield 15 by a non-magnetic spacer 12. The top portion 15a is called a trailing shield as the transducer is moved downwardly relative to a recording medium. The trailing shield reduces the overall field from the magnetic write pole 11 but increases the field gradient in the magnetic disc medium, which is essential for reducing bit transition width or the boundary between magnetic bits on the magnetic disc medium.

The portion of side magnetic shield 15 on both sides of the magnetic write pole 11 is separated from the magnetic writer pole 11 by a non-magnetic spacer 13.

Figure 2:
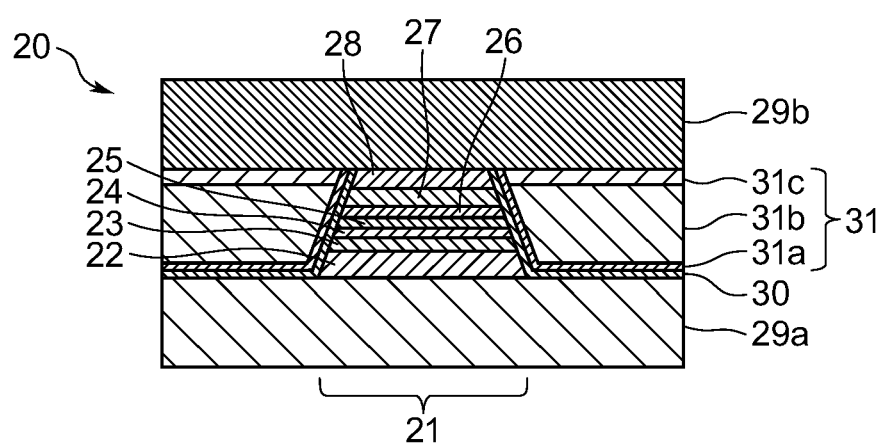
FIG. 2 is a plan view showing a configuration of a sensor in a HDD transducer.

As illustrated in FIG. 2, a reader 20 includes a hard-bias stack 31, a magneto-resistive sensor (stack) 21 sandwiched between a lower shield 29a and an upper shield 29b which are typically made of Permalloy. The hard-bias stack 31 includes a seed layer 31a, a high coercivity hard magnetic layer 31b that supplies a transverse field to the sensor 21, and a capping layer 31c.

An insulating layer 30 electrically separates the sensor 21 from the hard-bias stack 31. The magnetic sensor 21 typically includes an antiferromagnetic layer 22, a magnetic pinned-layer 23, a spacer layer 24, a magnetic reference layer 25, an insulating tunneling barrier layer 26, a magnetic free layer 27, and a capping layer 28.

The moment of the reference layer 25 is antiparallel-coupled to the magnetic pinned-layer 23 via the spacer layer 24. The moment of the pinned-layer 23 is pinned by the antiferromagnetic layer 22.

In some designs, the antiferromagnetic layer 22 is absent and the moment of magnetic pinned-layer 23 is aligned ("pinned") perpendicular to the Air Bearing Surface (ABS) by anisotropic stress. Moments of the magnetic pinned-layer 23 and the reference layer 25 are substantially perpendicular to the ABS whereas the moment of the magnetic free layer 27 is "biased" in the transverse direction by magnetic fields from the hard magnetic layer 31b.

Sensing current flows through the sensor stack 21 via the lower shield 29a and the upper shields 29b. Magnetic fields from bits on the magnetic disc medium rotate the moment of the magnetic free layer 27 perpendicular to the ABS, thereby, resulting in a resistance change of the sensor stack 21, which is registered as a voltage variation.

The magnetic write pole 11 is typically formed by electroplating or sputtering, whereas the sensor stack 21 is deposited by sputtering.

(2) First Embodiment

Figure 3:
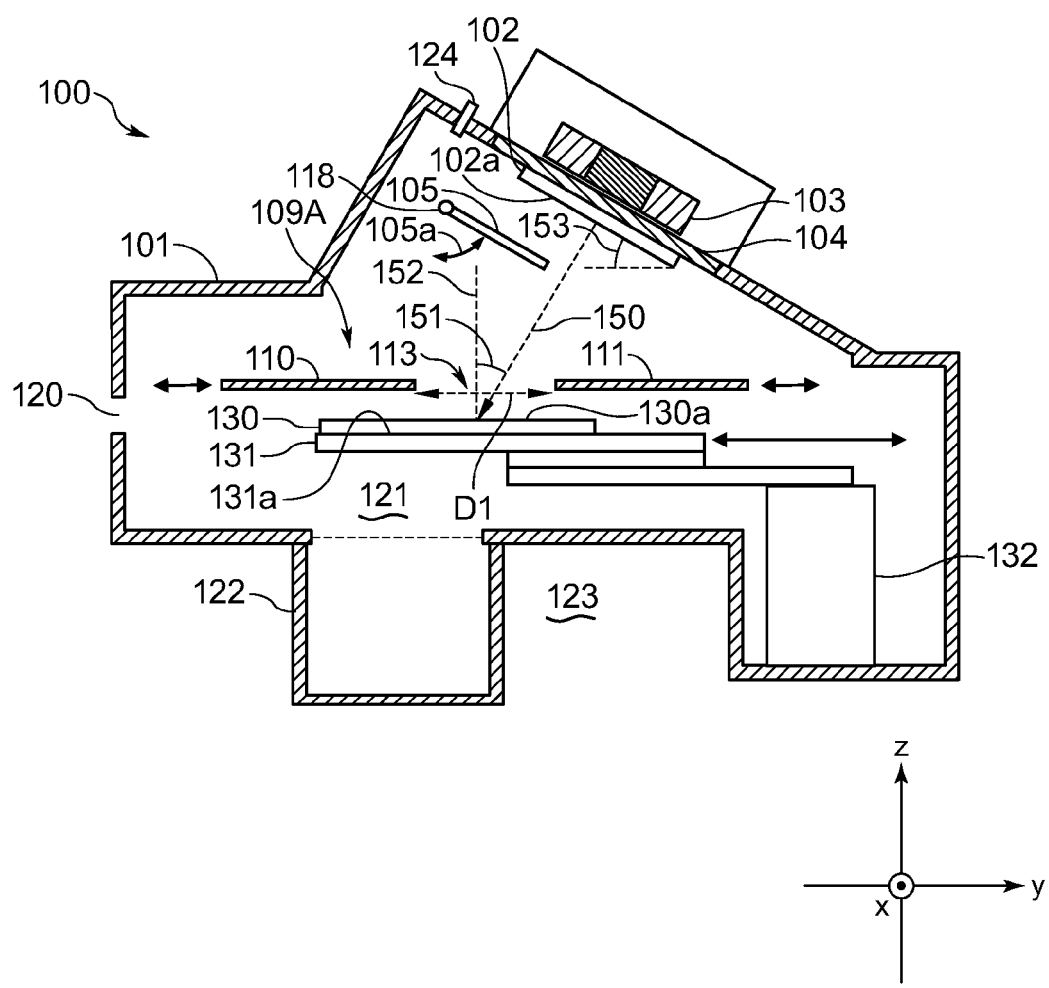
FIG. 3 is a cross-sectional view showing an entire configuration of a sputtering apparatus according to the first embodiment of the present invention.

Next, a sputtering apparatus according to the first embodiment of the present invention will be explained. As illustrated in FIG. 3, the sputtering apparatus 100 includes a target 102 and a target holder (metallic backing plate) 104 which function as a cathode part and are provided in the vacuum chamber 101, a magnet unit 103 which is constructed by permanent magnets and is disposed at the back side of the target holder 104, and a substrate holder 131 having a substrate receiving surface 131a.

Process gases for sputtering are supplied into the vacuum chamber 101 through a port 124 from an exterior of the vacuum chamber. Provided to the vacuum chamber 101 is a vacuum pump 122 for pumping out gases from the chamber. Moreover, provided in the vacuum chamber 101 is an entrance slit 120 for transporting a substrate 130 into the vacuum chamber 101 and out therefrom.

Power needed for sputtering is applied to the target 102 via the target holder (metallic backing plate) 104 from a power supply system (unillustrated). The power supply system is connected to an unillustrated RF power source and DC power source. Hence, one selected from the group consisting of only RF power, RF and DC power, and only DC power can be supplied to the target 102. Moreover, the target 102 has an elongated shape, and the long axis thereof is disposed perpendicular to the sheet of this figure (along x-axis). The length of the long axis of the target 102 is formed longer than a diameter of the substrate 130. Preferably, in order to ensure transverse film thickness uniformity, the length of the long axis of the target 102 is set to be equal to two times longer than the diameter of the substrate 130 or more.

The practical length of the target 102 is restricted by manufacturing cost. With the restricted length of the target 102, the transverse film thickness uniformity of the film characteristics can be improved by (1) reducing the distance between the target 102 and substrate in the deposition area, (2) providing a slit which runs along the lengthwise direction of the target 102 and which has wider opening at both ends compared to the center as disclosed in JP S60-197869 A, (3) increasing the magnetron intensity near the edges or conversely, decreasing the magnetron intensity at the center of the target 102.

In a case in which high power for sputtering is needed in order to form, especially a thick film, it is desired to provide a pipe (unillustrated) in which cooling water flows to cool the target 102 effectively in the target holder 104.

The substrate holder 131 is connected to a translating mechanism 132, and is provided to be movable in a linear manner along the y-axis by the translating mechanism 132. In this case, the direction of y-axis is parallel to the substrate surface 130a and perpendicular to the long axis of the target 102. The distance from the substrate receiving surface 131a of the substrate holder 131 to the center of the target 102 is set to be 150 mm or less.

The sputtering apparatus 100 according to this embodiment includes characteristic configurations of the present invention, aside from the above-described basic configurations. The characteristic configurations will be explained below. A mask assembly 109A is provided between the target 102 and the substrate 130 in the sputtering apparatus 100.

The mask assembly 109A has a first masking part 110 and a second masking part 111 which are disposed in parallel to the substrate receiving surface 131a of the substrate holder 131. The first masking part 110 and the second masking part 111 are disposed along y-axis (parallel to the substrate surface 130a and perpendicular to the long axis of the target 102) with the respective front edges of the first masking part 110 and the second masking part 111 facing each other and being spaced apart from each other by an interval of the width D1 (equal to or less than 200 mm). The first masking part 110 and the second masking part 111 of the mask assembly 109A are formed of a metallic member such as Ti or Al. However, the present invention is not limited by these materials. The mask assembly may be formed of Alumina, Glass, Ceramics, or other dielectrics at a floating potential, and thus preventing plasma near the target 102 from diffusing thereto.

Formed in a region located between the respective edges of the first masking part 110 and the second masking part 111 is an opening 113 with width D1 along the y-axis. The first masking part 110 and the second masking part 111 are respectively provided being independently movable along the y-axis (parallel to the substrate surface 130a and perpendicular to the long axis of the target 102). By translating the first masking part 110 and the second masking part 111, a position of the opening 113 and width D1 of the mask assembly 109A can be modified.

That is, by moving the first masking part 110 along the y-axis direction with the second masking part 111 being fixed, the width D1 of the opening 113 can be increased and decreased. Similarly, by moving the second masking part 111 along the y-axis with the first masking part 110 fixed, the width D1 of the opening 113 can be increased and decreased. Moreover, by moving the first masking part 110 and the second masking part 111 at the same time in the same direction along the y-axis by the same distance, a position of the opening 113 can be moved relative to the first-masking-part-110 side or the second-masking-part-111 side with the width D1 of the opening 113 maintained.

In the present invention, in order to control the magnetic anisotropy of magnetic films, it is necessary to deposit at various incidence angles. The width D1 of the opening 113 may also be varied to control the incidence angle distribution.

Moreover, the target 102 is disposed such that the normal line passing through the center of the opening 113 of the mask assembly 109A is not coincident to the plane which includes the normal line 150 passing through the center of the target surface 102a and parallel to the long axis of the target 102.

For this embodiment, the target 102 is disposed such that the normal line 150 passing through the center of the target surface 102a is tilted by a predetermined angle 151 relative to a normal line 152 to the substrate surface 130a. The target 102 is disposed at an angle relative to the masking parts 110 and 111. Therefore, the surface 102a of the target 102 obliquely faces the substrate surface 130a through the opening 113 of the masking assembly 109A.

A third masking part 105 is further provided adjacent to the target 102 and between the target 102 and the substrate 130. The third masking part 105 is rotatable around a rotation axis 118 parallel to the x-axis in the vacuum chamber. The third masking part 105 is rotated along a rotation direction 105a, and thus is disposed so as to cover a portion of the target surface 102a toward the first-masking-part side 110.

As described above, the target 102 is disposed obliquely, being tilted by a predetermined angle 153 relative to the y-axis. Sputtered particles ejected normal to the target surface 102a are obliquely incident to the substrate 130.

In accordance with the sputtering apparatus 100 as described above, the first masking part 110 and the second masking part 111 are translated in order to set the width D1 and position of the opening 113 of the mask assembly 109A. The third masking part 105 may also be actuated to expose all the target surface 102a or to cover a portion thereof. Hence, according to the sputtering apparatus 100, an arrangement of the target 102 and the substrate 130 during deposition can be optimized for various kinds of targets that may have different oblique deposition properties.

For example, for large incidence angles, the third masking part 105 is disposed substantially parallel to the target surface 102a as illustrated in FIG. 3, thereby blocking sputtered particles ejected in a substantially normal direction from the target surface 102a. Accordingly, sputtered particles are deposited on the substrate 130 through the opening 113 only from the second-masking-part-111 side of the target surface 102a, and thus only sputtered particles with high incidence angles are deposited on the substrate 130 with the opening 113 being located at the first-masking-part-110 side.

For low incidence angle depositions, the third masking part 105 is preferably rotated to substantially expose the target surface 102a. Consequently sputtered particles can be deposited on the substrate 130 from a larger portion of the target surface 102a, thereby further increasing a deposition rate.

According to the sputtering apparatus 100, in order to obtain the predetermined incidence angle as described above, the first masking part 110, the second masking part 111, and the third masking part 105 are initially arranged and power to the target is applied through the plate 104. Subsequently, the substrate holder 131 with the substrate 130 is translated along the y-axis direction at a constant speed. Thus, deposition is made over the whole surface of the substrate 130 at the same incidence angle and at the same distance between the target surface 102a that sputtered particles are emitted therefrom and a portion of the substrate surface 130a that the emitted particles are deposited thereon. Accordingly, magnetic layers with uniform magnetic anisotropy and low skew can be formed.

(3) Second Embodiment

Next, a sputtering apparatus according to the second embodiment will be explained. The sputtering apparatus according to this embodiment comprises a masking assembly with a different configuration in comparison with first embodiment. Hereinafter, only a configuration of the mask assembly will be explained.

Figure 4:
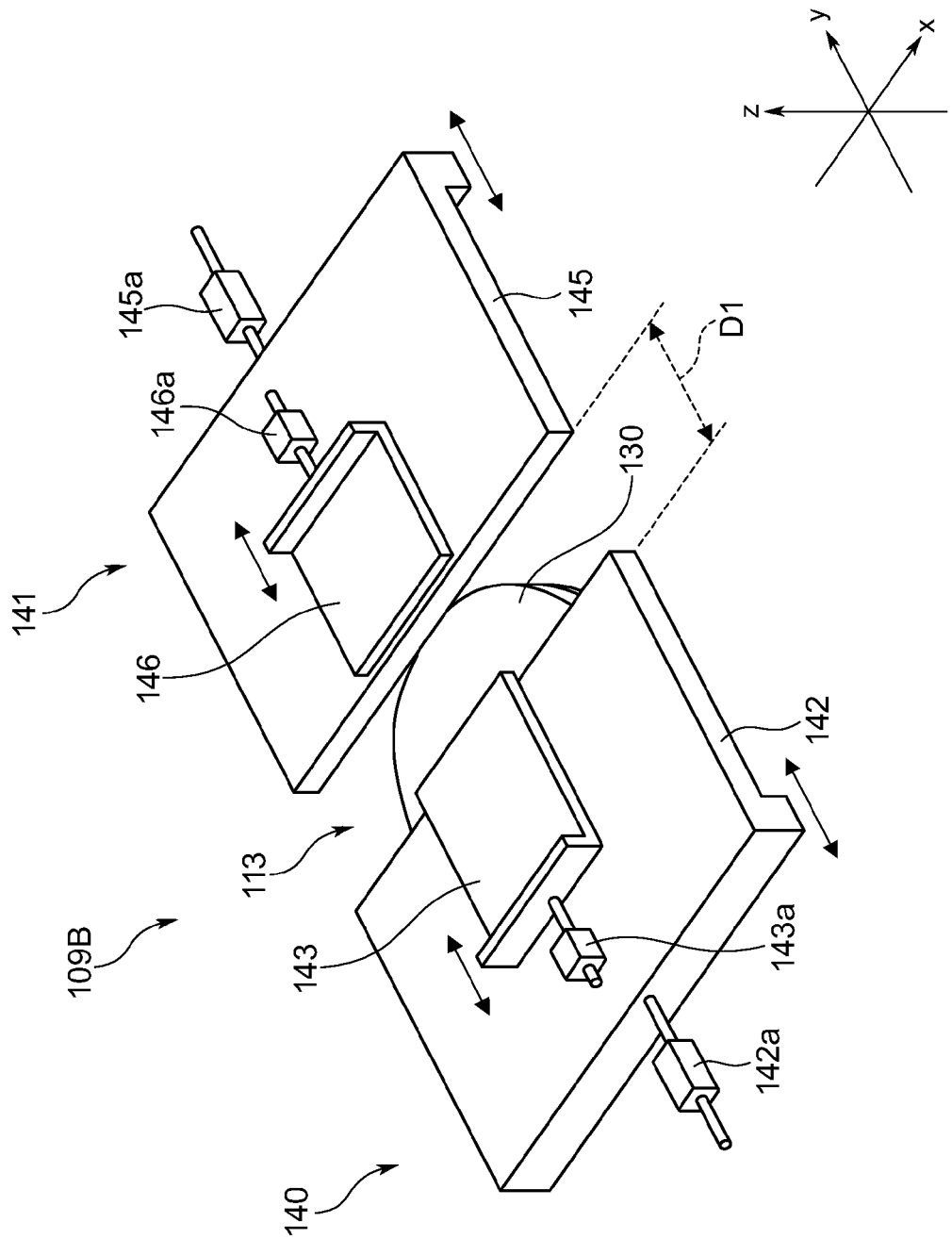
FIG. 4 is a perspective view showing a mask assembly according to the second embodiment of the present invention.

As illustrated in FIG. 4, a mask assembly 109B according to the second embodiment comprises a first masking part 140 and a second masking part 141 having edges that are separated by an interval of a width D1.

The first masking part 140 has a main masking part 142 and a center masking part 143. The main masking part 142 is connected to an actuator 142a for movement along the y-axis. The center masking part 143 is formed so that the length along the x-axis is shorter than that of the main masking part. The center masking part 143 is disposed at the center (along the x-axis) of the top surface of the main masking part 142. The substrate 130 is preferably translated under the opening with width D1 under the center masking part 143. The center masking part 143 is connected to an actuator 143a, for movement along the y-axis relative to the main masking part 142.

Similarly, the second masking part 141 has a main masking part 145 and a center masking part 146. The main masking part 145 is connected to an actuator 145a for movement along the y-axis direction. The center masking part 146 is formed with the length along the x-axis direction being shorter than that of the main masking part 145, and is disposed at the center of the top surface of the main masking part 145. The center masking part 146 is connected to an actuator 146a for movement along the y-axis relative to the main masking part 145.

Similar to the first embodiment, the width D1 and position of the opening 113 can be modified by moving the main masking part 142 of the first masking part 140 and the main masking part 145 of the second masking part 141.

Figure 5:
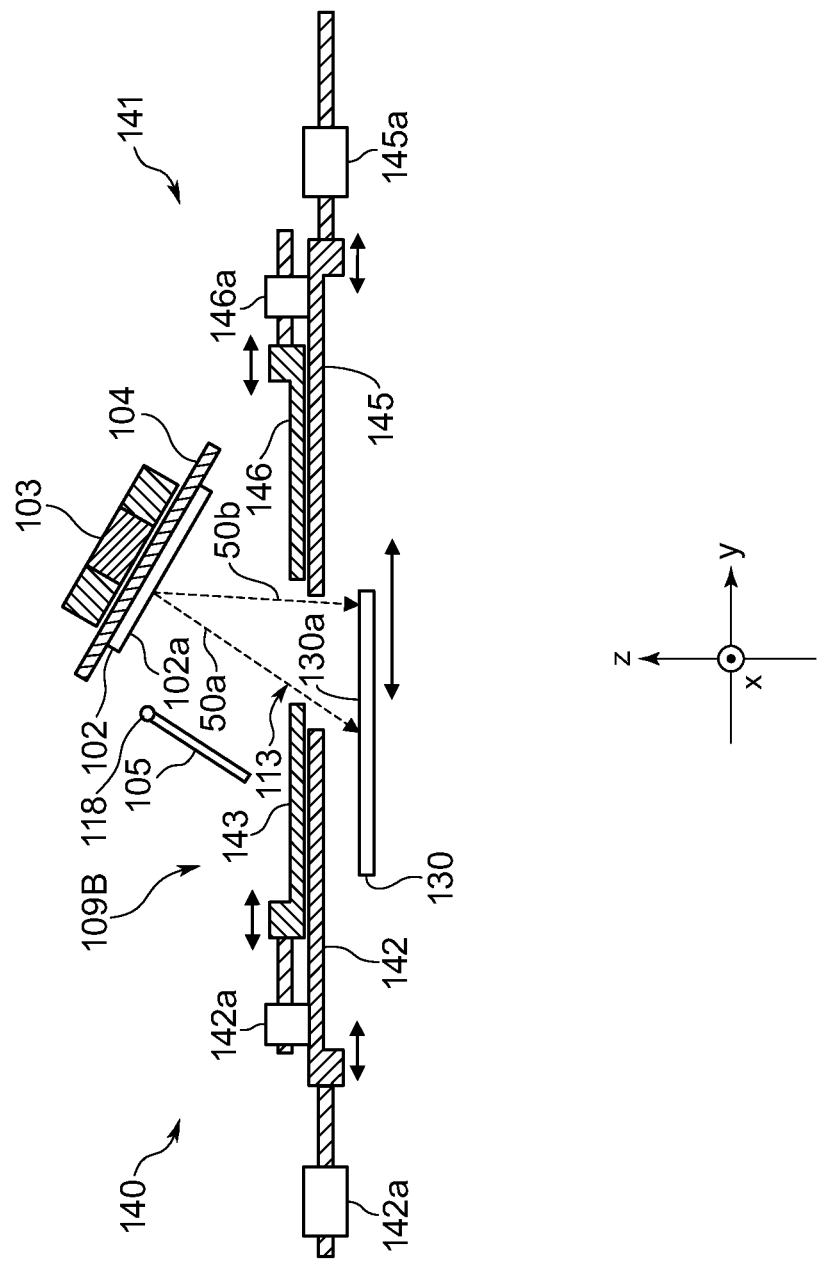
FIG. 5 is a vertical cross-sectional diagram showing an operation procedure of the mask assembly according to the second embodiment of the present invention.

Furthermore, according to the mask assembly 109B of the second embodiment, by moving the center masking parts 143 and 146, a width of the central part of the opening 113 can be shortened. Therefore, the deposition rate can be decreased at the central part of the substrate 130 along the x-axis direction. Modification of a portion of the opening 113 therefore provides a way to compensate for decreased deposition at the substrate edges due to a short target or to a plasma concentrated in the middle of the target FIG. 5 shows an exemplary low incidence angle deposition configuration for obtaining films with low magnetic anisotropy. The third masking part 105 is opened to expose the target surface 102a. Deposition is restricted to particles with trajectories defined by the opening 113 and within the range bound by lines 50a and 50b. The center masking part 143 of the first masking part 140 is disposed so as to protrude from an edge of the main masking part 142 thereby reducing the width of a central part of the opening 113 that lessens deposition onto the central portion of the substrate 130 to compensate for reduced deposition near the edges due to a short target, long separation distance between target and substrate, or lower plasma density at the target edges. Moreover, sputtered particles with incidence angles exceeding the trajectory 50a are restricted as high incidence angle particles give rise to high anisotropy values.

Figure 6:
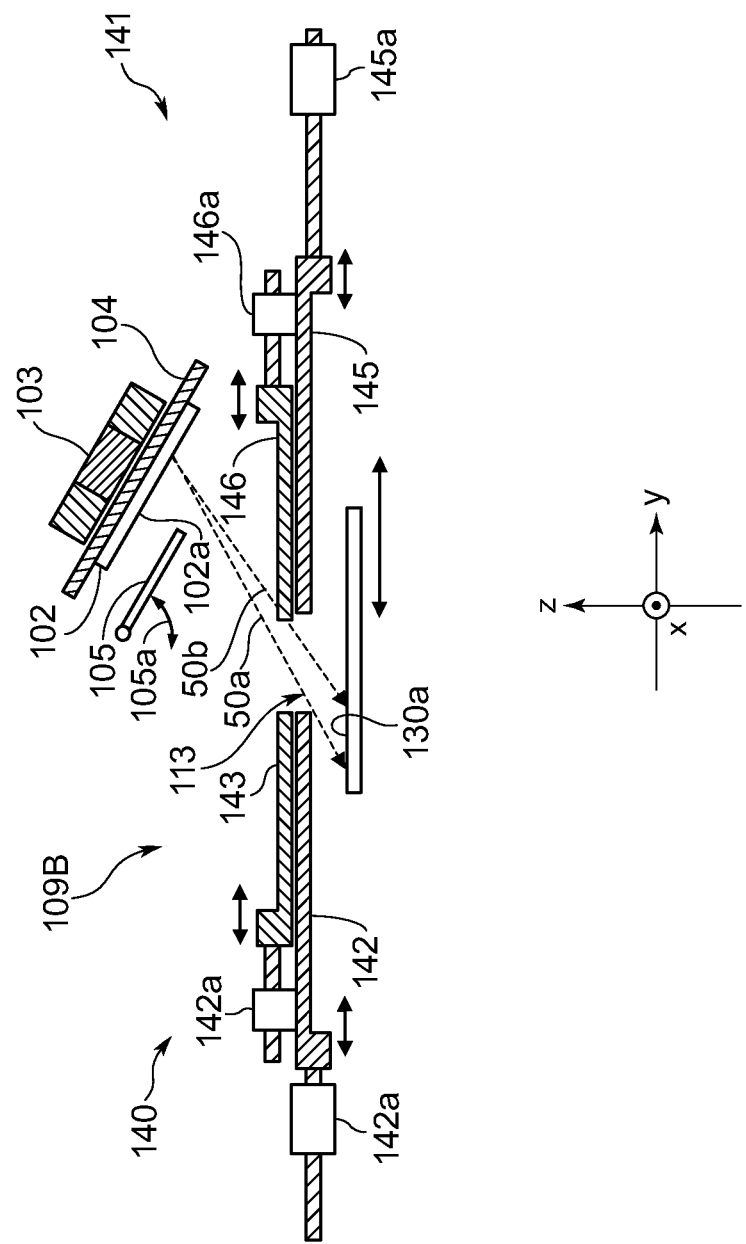
FIG. 6 is a vertical cross-sectional diagram showing an operation procedure of the mask assembly according to the second embodiment of the present invention.

FIG. 6 shows an exemplary high incidence angle deposition configuration for obtaining films with high magnetic anisotropy. The third masking part 105 is disposed to block a portion of the target surface 102a by setting it substantially parallel thereto. Sputtered particles that are deposited on the substrate surface 130a arise mainly from the portion of the target surface 102a that is not blocked by the masking part 105. The trajectory of particles deposited particles through the opening 113 is restricted within the range 50a to 50b.

Accordingly, only sputtered particles with large incidence angles are deposited on the substrate surface 130a. Furthermore, the center masking part 146 of the second masking part 141 is disposed so as to protrude from the edge of the main masking part 145, reducing the width of the central part of the opening 113. The protruded configuration of mask 146 results in reduced deposition on a central part of the substrate surface 130a that may correct for less deposition at the edges. By arranging the center masking part 146 over the edge of the main masking part 145 instead of protruding center masking part 143 over the edge of main masking part 142, lower incidence angle particle trajectories are restricted (to angles steeper than line 50b) to favor conditions that give rise to higher anisotropy.

(Modification)

Figure 7:
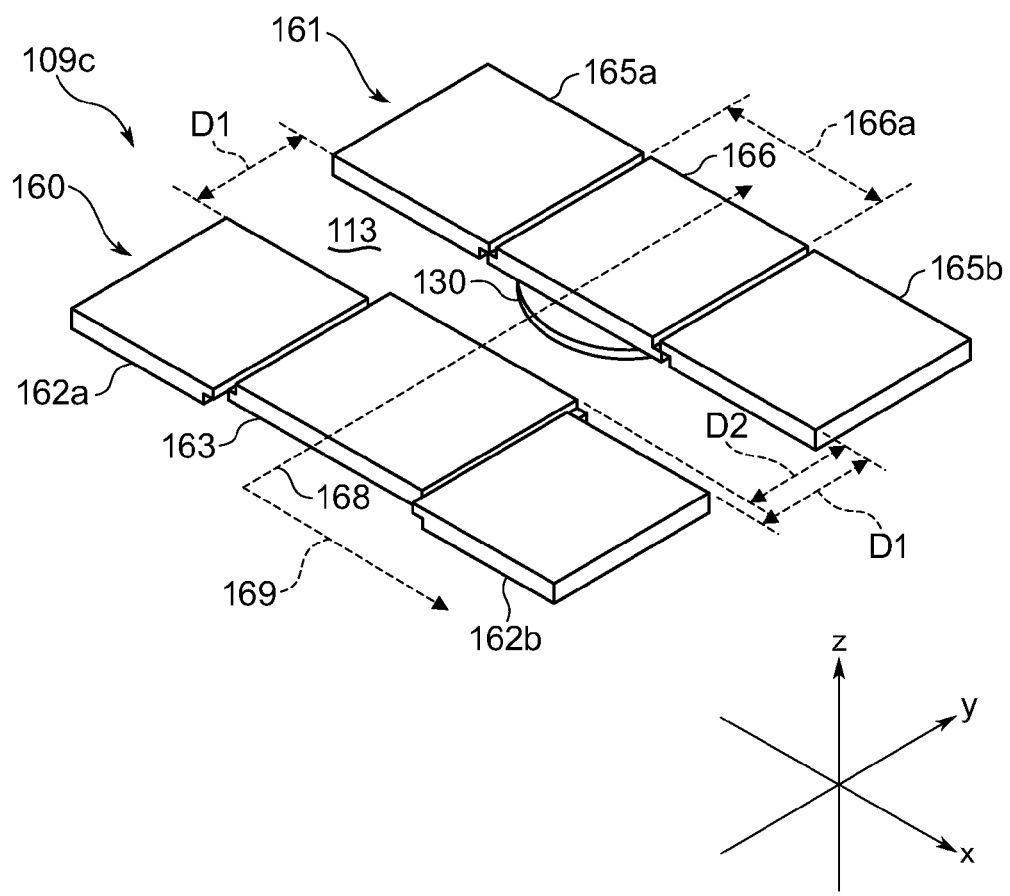
FIG. 7 is a perspective view showing a modification of the mask assembly according to the second embodiment of the present invention.

A modification of a mask assembly according to the second embodiment will be described next. As illustrated in FIG. 7, the mask assembly 109c has a first masking part 160 and a second masking part 161 that are disposed with respective edges thereof facing each other and separated from each other by an interval of a width D1.

The first masking part 160 includes a pair of main masking parts 162a, 162b which are on the same level, and a center masking part 163 located therebetween. The main masking parts 162a, 162b are connected to respective driving parts (unillustrated) and movable in a unified manner. The center masking part 163 is connected to a driving part (unillustrated), and provided so as to be independently movable along the y-axis from the main masking parts 162a, 162b.

Similarly, the second masking part 161 includes a pair of main masking parts 165a, 165b which are on the same level and a center masking part 166 located therebetween. The main masking parts 165a, 165b are connected to respective driving parts (unillustrated), and provided so as to be movable in a unified manner. The center masking part 166 is connected to a driving part (unillustrated), and provided so as to be independently movable along the y-axis.

As described above, according to the mask assembly 109c of this modification, by moving the center masking part 163,166 as needed, the width D2 of only the central part of the opening 113 can be changed. Hence, a similar effect of the above-described second embodiment can be obtained.

Moreover, in a case of this modification, by disposing the center masking part 163 (166) between the pair of main masking parts 162a, 162b (165a, 165b) along the x-axis, the thickness of the mask assembly can be made thinner in comparison with that of the second embodiment.

According to the second embodiment and this modification, the respective facing edges of the center masking parts 163,166 are preferably straight but may also be curved.

(Simulation)

Figure 8:
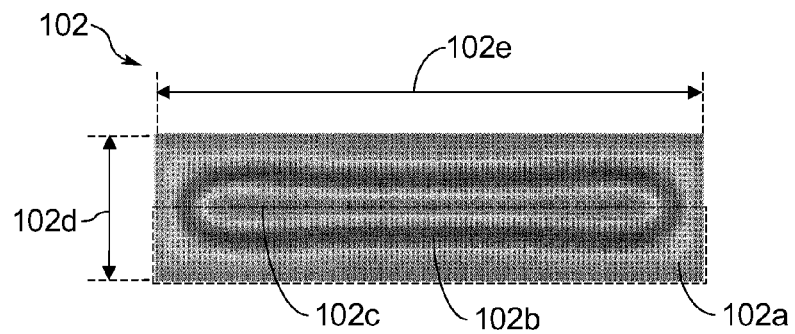
FIG. 8 is a front elevational view showing a target surface simulated in the modification of the mask assembly according to the second embodiment of the present invention.

A simulation modeled on the mask assembly according to this modification will be explained next. FIG. 8 shows an erosion pattern of a target 102 used for simulating a deposited film thickness profile. The target 102 has a width 102d (130 mm) and a length 102e (510 mm). An erosion pattern formed by a given magnet unit is shown on the target surface 102a.

For high incidence angle deposition, it is advantageous to limit the deposition to particles sputtered from the lower erosion groove 102b below a target centerline 102c and enclosed by a dashed rectangle.

Figure 9:
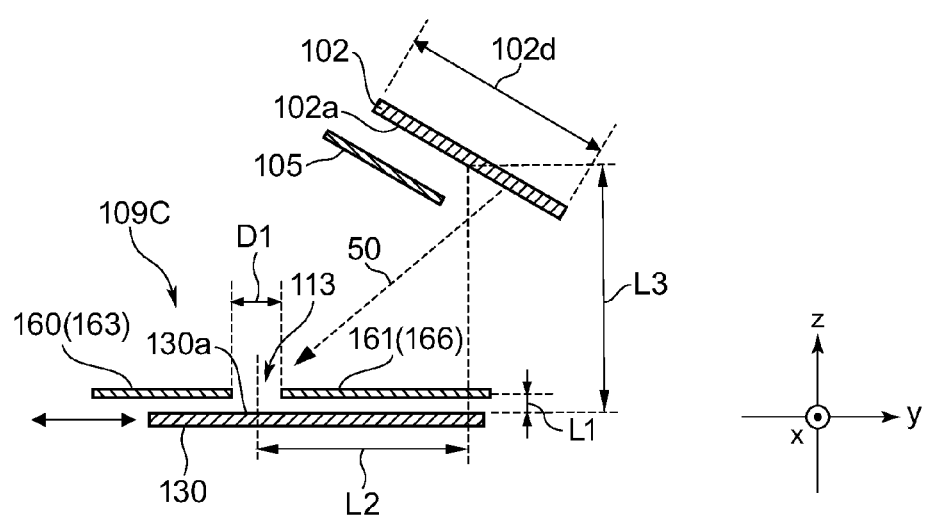
FIG. 9 is a schematic view showing a geometrical relationship of a target, a mask assembly and a substrate used in the simulation of the modification of the mask assembly according to the second embodiment of the present invention.

FIG. 9 shows the geometrical relationship of the mask assembly 109c with the target 102. The width D1 of the opening 113 of mask assembly 109c is set to 20 mm. The target surface 102a is at an angle of 30° relative to the substrate surface 103a, and is at a distance L3 (150 mm) from the substrate surface 130a.

The mask assembly 109c is a distance L1 (27 mm) from the substrate surface 130a. The thickness of the mask assembly 109c is assumed to be negligible in the simulations. The opening 113 has a center which is a distance L2 (127 mm) from the center of the target 102.

The third masking part 105 blocks sputtered particles from an erosion groove above the target center (above the centerline 102c shown in FIG. 8) but allows sputtered particles from the lower erosion groove (enclosed by dashed rectangle in FIG. 8) with trajectory 50 toward the opening (average incidence angle of 50° relative to a normal axis of substrate surface 130a).

During deposition, the substrate is moved along a direction (y-axis) parallel to the substrate surface 130a under the opening 113. The velocity distribution of sputtered particles is taken as $\cos^n \phi - n_2 \exp(-\phi^2/1000)$, where $\phi$ is an angle measured from a normal axis of target surface 102a, n=0.75, and $n_2$=0.5.

Figure 10:
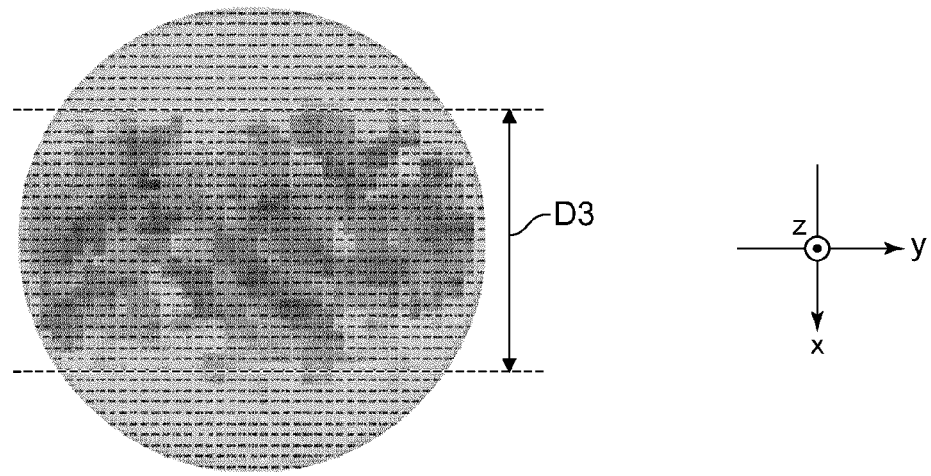
FIG. 10 is a film thickness pattern showing a simulation result (1) of the modification of the mask assembly according to the second embodiment of the present invention.

FIG. 10 is a simulated film thickness pattern on a substrate surface 130a. The deposited film on the darker regions is thicker than on the lighter regions. The non-uniformity of film thickness is 10.2% (Range/Mean). The film is thicker in the central region defined by a width D3 of approximately 120 mm.

Figure 11:
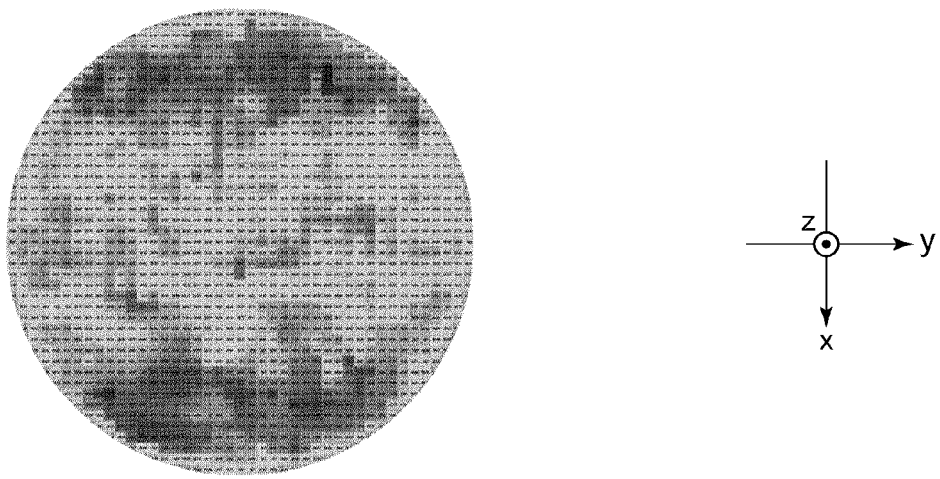
FIG. 11 is a film thickness pattern showing a simulation result (2) of the modification of the mask assembly according to the second embodiment of the present invention.

FIG. 11 shows the simulation results with the center masking part 166 of the second masking part 161 protruding into the opening 113 by 1 mm. The non-uniformity is reduced to 6.2%. The thickness in the outer portion was increased compared to that in the middle portion.

The edge of the center masking part 166 of the second masking part 161 is assumed to be straight, but a slightly curved edge is expected to further improve film uniformity.

(Another Modification)

Figure 12:
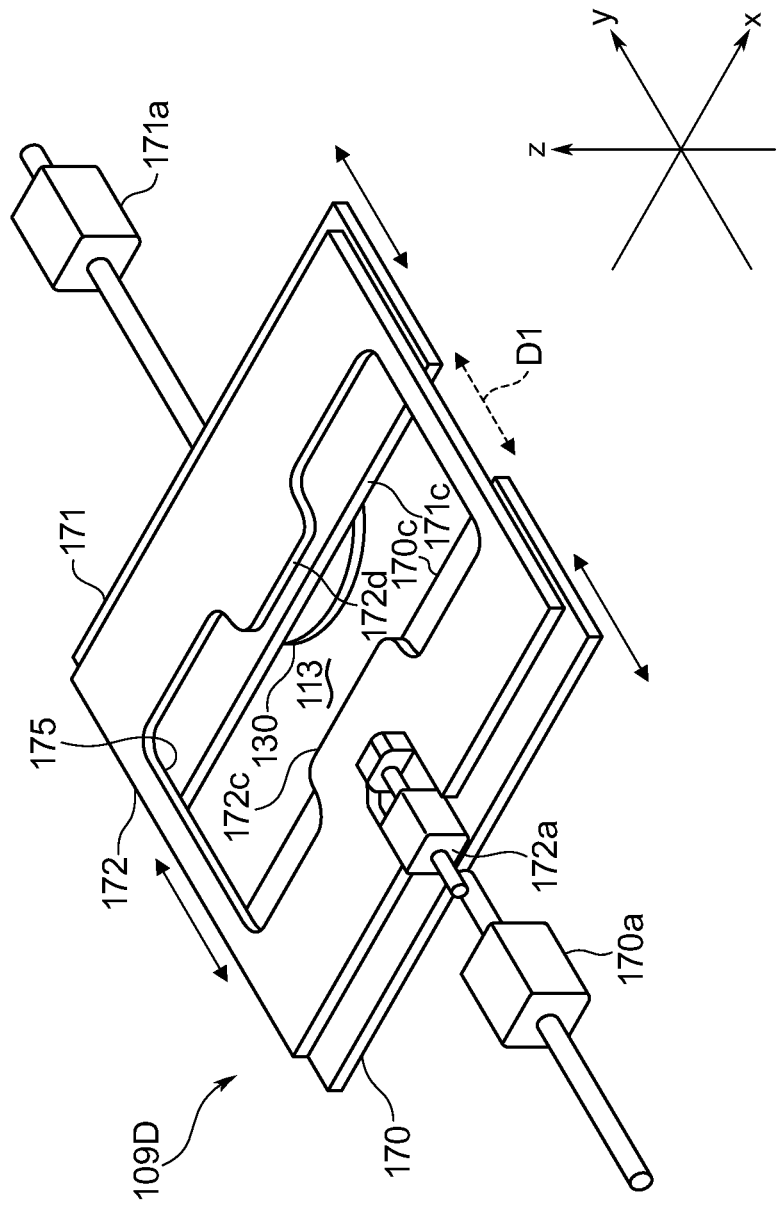
FIG. 12 is a perspective view showing another modification of the mask assembly according to the second embodiment of the present invention.

Another modification of the mask assembly according to the second embodiment will be explained next. As illustrated in FIG. 12, a mask assembly 109D includes a first masking part 170, a second masking part 171, and a center masking part 172. The first masking part 170 is connected to a driving part 170a and movable along the y-axis direction. Similarly, the second masking part 171 is connected to a driving part 171a and is also movable along the y-axis direction. The first masking part 170 and the second masking part 171 are disposed with respective front edges 170c, 171c facing each other and separated by an interval of width D1.

The center masking part 172 is constructed from a plate member with an aperture 175, and disposed on the top surface of the first masking part 170 and the second masking part 171. The center masking part 172 is connected to a driving part 172a and independently movable along the y-axis direction from the first masking part 170 on which the driving part 172a is mounted.

The aperture 175 is shaped like a dumbbell section. In the midsection along the x-axis direction of the aperture 175 are provided protrusions 172c, 172d.

The opening 113 and width D1 are modified by actuating the first masking part 170 and the second masking part 171. In addition, by moving only the center masking part 172, a width of the central part of the opening 113 can be modified. Hence, the same advantages as those of the second embodiment can be obtained.

(4) Third Embodiment

A sputtering apparatus according to a third embodiment of the present invention will be explained next. The same reference numerals are utilized for components similar to the first embodiment, and the explanation thereof will be omitted.

Figure 13:
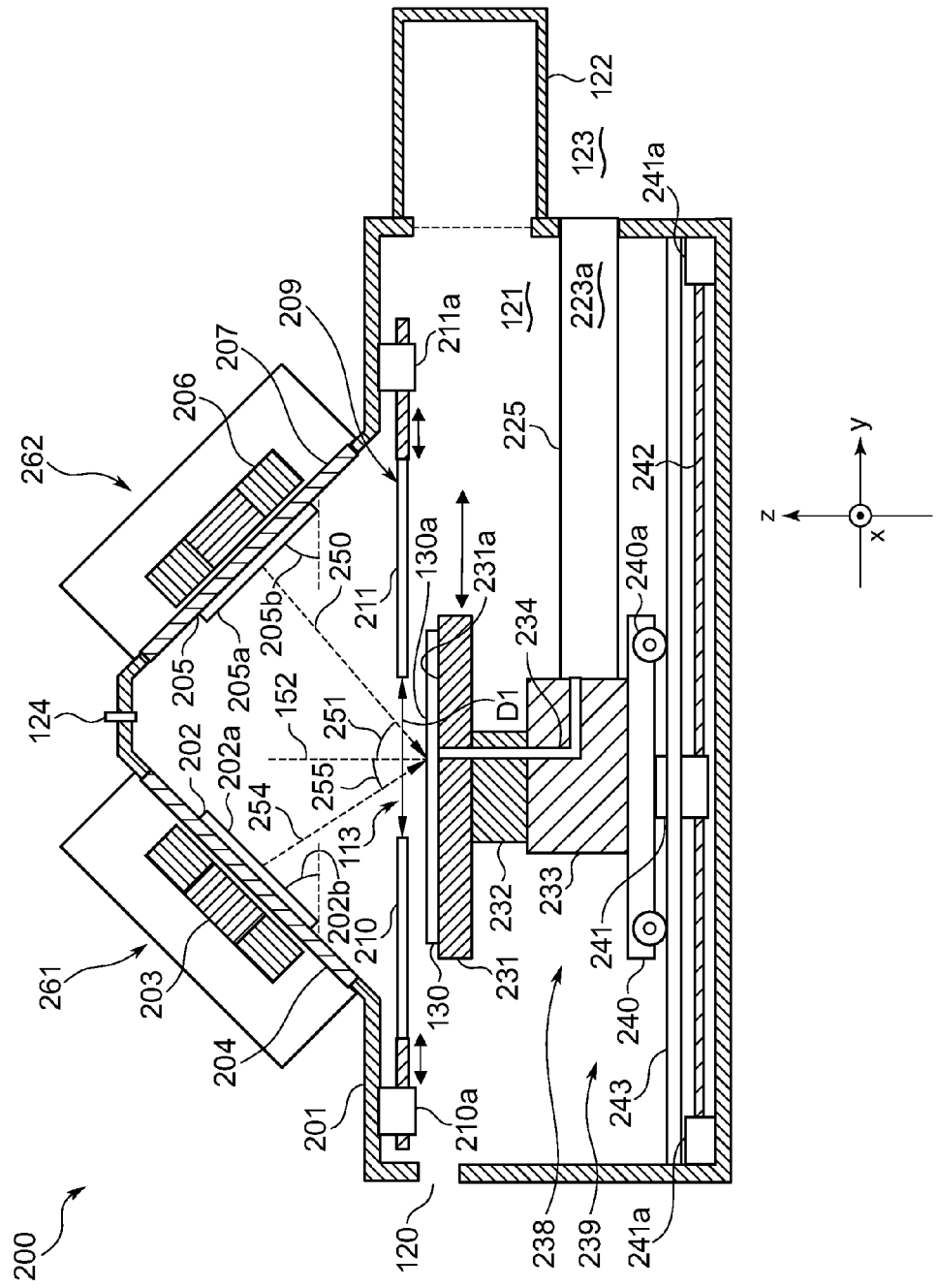
FIG. 13 is a vertical cross-sectional view showing an entire configuration of a sputtering apparatus according to the third embodiment of the present invention.

As illustrated in FIG. 13, the sputtering apparatus 200 includes a first cathode 261, a second cathode 262, and a substrate holder 231 in a vacuum chamber 201. The first cathode 261 has a first target holder 204, a magnet unit 203 provided at the back side of the target holder 204, and a target 202. Similarly, the second cathode 262 has, a target holder 207, and a magnet unit 206 provided at the back side of the target holder 207, and a second target 205. The first target 202 and the second target 205 may be formed of the same kind of materials or of different materials.

Electrical power for sputtering is supplied to the first target 202 and the second target 205 through the respective target holders 204, 207 from power supply lines connected to an RF power and/or a DC power source (unillustrated). The first target 202 and the second target 205 have a rectangular shape with the long axes disposed perpendicular to the sheet (x-axis) and the length thereof being longer than the diameter of the substrate 130.

The substrate holder 231 is disposed on a substrate cooling stage 238, and is movable along the y-axis direction by a translating mechanism 239. The substrate cooling stage 238 includes a cryogenic cold head 232 and a cryopump 233. A cooling gas line 234 is provided to improve thermal transfer between the substrate 130 and substrate holder 231. Cooling gas is supplied through a line (unillustrated) arranged inside an internal space 223a of a bellows (extendable pipe) 225.

The bellows 225 is connected to an exterior space 123 and is compressed or extended depending on the movement of the substrate cooling stage 238.

The translating mechanism 239 may include a driving means (motor) 241a provided at a bottom surface of the vacuum chamber 201, a worm gear 242 disposed along the y-axis, a linearly-moving block 241 attached to the worm gear 242, a cart 240 connected to the linearly-moving block 241, and a guide rail 243 arranged parallel to the worm gear 242 which is connected to the driving means 241a. The substrate cooling stage 238 is set on the movable cart 240 allowing for motions along the y-axis during deposition.

The mask assembly 209 disposed between the targets and the substrate 130 includes a first masking part 210 and a second masking part 211 that are disposed parallel to the substrate receiving surface of the substrate holder 231. The first masking part 210 and the second masking part 211 have adjacent edges spaced by a width D1 which forms an opening 113 for sputtered particles to go through to the substrate.

The first masking part 210 is connected to a driving means 210a for translation along the y-axis. Similarly, the second masking part 211 is connected to a driving means 211a for independent translation along the y-axis. Translation of the masking parts sets the position and width D1 of the opening 113.

The first target 202 and the second target 205 are tilted relative to a substrate holder 231a. The first target 202 is disposed such that a normal line from the center of the first target surface 202a is tilted by a predetermined angle 255 (equal to or greater than 15 degrees and equal to or smaller than 45 degrees) relative to substrate holder 231 normal line 152 passing through the mask assembly opening 113.

The second target 205 is disposed such that a normal line from the center of the second target surface 205a is tilted by a predetermined angle 251 (equal to or greater than −15 degrees and equal to or smaller than −45 degrees) relative to the normal line 152.

Thus, the first target 202 and the second target 205 are configured on either side of the masking assembly opening 113, partially, facing each other with the surfaces 202a, 205a tilted relative to the substrate surface 130a. Therefore, sputtered particles from the first target surface 202a follow a trajectory 254 and are deposited on the substrate 130 at an angle 255. Similarly, sputtered particles ejected from the second target surface 205a follow a trajectory 250 and are deposited on the substrate 130 at an angle 251.

As explained above, according to the sputtering apparatus 200, by moving the first masking part 210 and the second masking part 211 of the mask assembly 209 as needed, the position and width D1 of the opening 113 can be modified providing advantages similar to the first embodiment.

Moreover, according to the sputtering apparatus 200 of this embodiment, sputtering can be sequentially carried on a cooled substrate 130.

For multilayer devices, films with varying thicknesses may be necessary. Thick layer films may need thin films as seed layers. A seed layer may improve adhesion between a substrate and the thick film, form a crystallographic template for the thicker film to form on, and define the microstructure for the subsequent thick layer film. Thin layer films may also function as a protection layer for a sensitive thick layer.

A thin film may also function as a tunnel barrier to insulate two thick metallic films from each other or provide special properties such as anti-parallel coupling between two thick magnetic layers. For example, a writer of a transducer of HDD includes two double layers such as Fe—Co and Ni—Fe alloys. Each of the double layers has a NiFe (Permalloy) layer (1 nm) and a high Hk FeCo film (200 nm). A thin Permalloy layer not only facilitates the formation of FeCo layer, but also becomes an underlayer in order to reduce the grain size. A metallic thin film such as NiFe, Ru, or Ta may be used for protecting the layer stack.

In order to form films of different thicknesses, deposition is typically carried out with a wide range of deposition rates. By controlling power supplied to a cathode, deposition rate can be controlled near 1% of the maximum deposition rate. However, the plasma distribution is not always the same in the available cathode power range. For elongated cathodes at low power, the plasma distribution is typically concentrated in the center of the target, resulting in poor film thickness uniformity.

For a sputtering apparatus having a substrate holder configured to movably support a substrate relative to a target, the deposition rate may be reduced by shortening the duration that a substrate is exposed to sputtered particles by increasing the translation speed of the substrate holder. However, a substrate holder that includes heating and cooling mechanisms can be very heavy and therefore difficult to translate at high speeds.

The deposition rate may be reduced by reducing the power supplied to a target. However, power reduction may change the plasma profile on the target surface, resulting in poor film thickness uniformity. For example, in order to deposit a 1 nm seed layer or protection layer for a thick 200 nm film, the necessary substantial change in power may change the plasma distribution, thereby resulting in poor film thickness uniformity.

According to the sputtering apparatus 200 of this embodiment, the deposition rate may be reduced without having to substantially change the power supplied to the target 202, 205 by reducing the width D1 of the opening 113 and without venting the apparatus 200 to atmosphere.

Therefore, in the above 1 nm-thick film example, in addition to a translation speed increase, the deposition rate may further be reduced by reducing the opening width D1 which limits the necessary reduction in power to levels that do not significantly affect the plasma profile and therefore the deposited film uniformity.

(5) Fourth Embodiment

Next, a sputtering apparatus according to the fourth embodiment of the present invention will be explained. Similar reference numerals will be provided to components similar to the third embodiment, and detailed explanation will be omitted. The sputtering apparatus according to this embodiment is different from the third embodiment in that the substrate holder is fixed and the cathodes are instead linearly movable.

Figure 14:
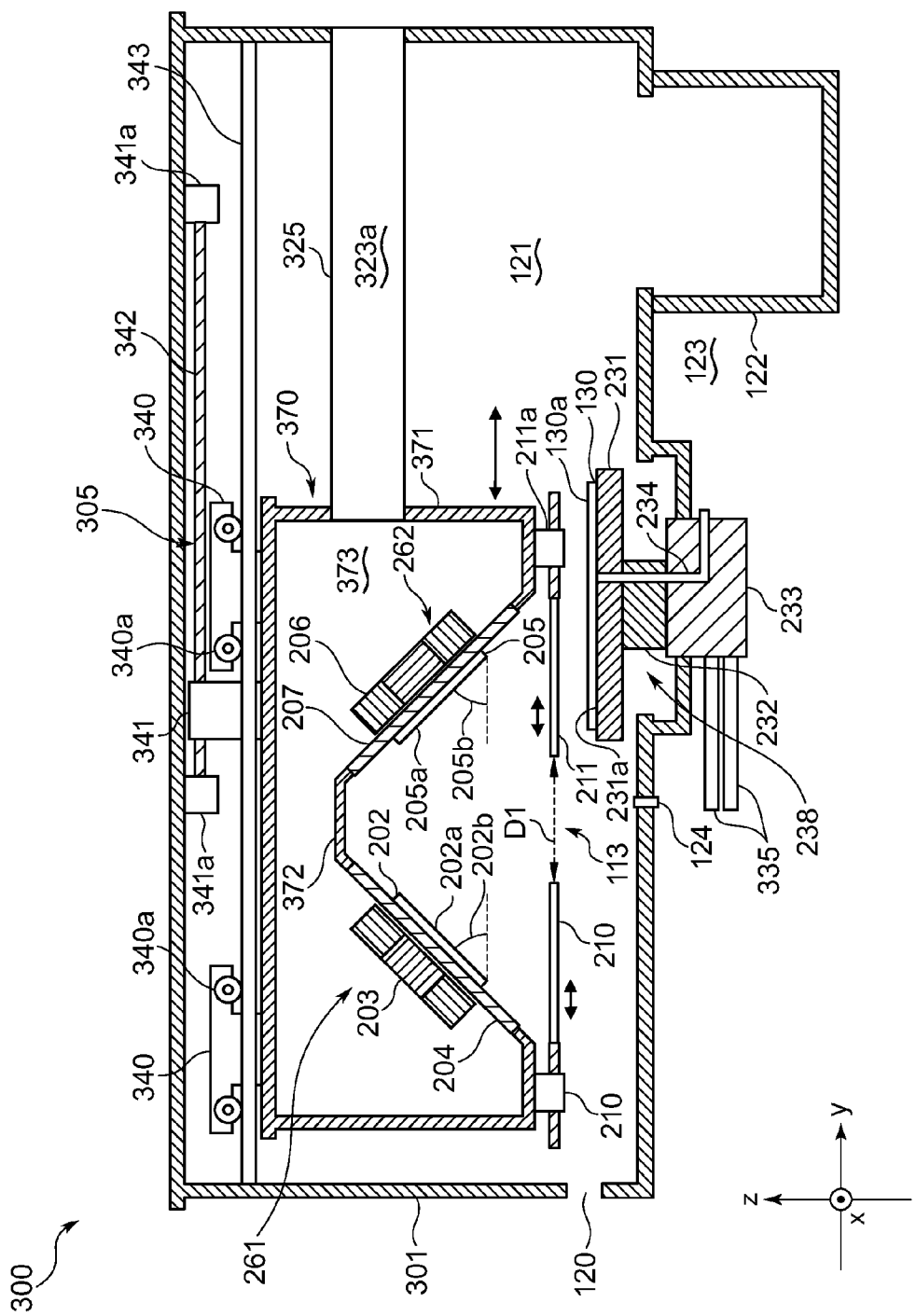
FIG. 14 is a vertical cross-sectional view showing an entire configuration of a sputtering apparatus according to the fourth embodiment of the present invention.

As illustrated in FIG. 14, a sputtering apparatus 300 includes a target assembly 370 and a substrate holder 231 in a vacuum chamber 301. The target assembly 370 has an assembly main body 371, a first cathode 261, a second cathode 262, and a mask assembly 209. The cathodes and mask assembly are movable in a linear manner along the y-axis by a translating mechanism 305 in the vacuum chamber 301. The length of each of the long axis of the first target 202 and the second target 205 is longer than the diameter of the substrate 130.

The assembly main body 371 is formed of a housing member with an inverted V-shaped portion 372. Provided on surfaces of the inverted V-shaped portion 372 are the first cathode 261 and the second cathode 262. A mask assembly 209 is provided in the opening of the inverted V-shaped portion 372 so as to span the opening.

A movable conduit 325 such as a bellows is utilized to provide access to the assembly main body 371 from the outside 123 through a side wall of the vacuum chamber 301. Power supply lines (unillustrated) for the first and second targets 202, 205 are arranged inside the conduit 325.

The translating mechanism 305 includes a driving part 341a provided on the ceiling surface in vacuum chamber 301, a worm gear 342 provided along y-axis, a linearly-moving part (gear) 341 attached to the worm gear 342, two carts 340, and a guide rail 343 disposed parallel to the worm gear 342. The worm gear 342 is connected to a driving part 341a. The carts 340 have wheels 340a and are connected to a top surface of the assembly main body 371. The wheels 340a are formed to roll along the guide rail 343. The linearly-moving part 341 is fixed on the assembly main body 371.

The driving part 341a transmits torque to the worm gear 342. The linearly-moving part 341 attached to the worm gear 342 is translated along the worm gear 342 when the worm gear 342 is rotated. With a linear movement of the linearly-moving part 341, the assembly main body 371 connected to the linearly-moving part 341 is translated along the guide rail 343. The translating mechanism 305 moves the assembly main body 371 along the y-axis.

A stage 238 having a substrate holder 231 with a substrate receiving surface 231a is disposed in the vacuum chamber 301 opposite to assembly main body 371. The substrate holder 231 is thermally attached to a cold head 232 cooled by a pump 233 connected to an external compressor (unillustrated) by compressed gas lines 335.

Sputtered particles from the targets are collimated by the mask assembly 209. A width D1 of the opening 113 is controlled by relative translation of the first masking part 210 and the second masking part 211 along the y-axis direction. Accordingly, the advantages similar to the first embodiment can be obtained.

Moreover, according to the sputtering apparatus 300 of this embodiment, as similar to the above third embodiment, with the substrate 130 being cooled, sputtering can be sequentially carried out from the first target 202 and the second target 205. Furthermore, the target assembly 370 is formed to be movable, and thus the substrate holder 231 is fixed. Hence, the configuration can be simplified as it is relatively easier to provide flexible electrical and water lines to the cathodes than to provide movable compressed He lines for the cooling pump 233. Repeated tight bending of compressed gas lines reduce the operation lifetime thereof.

(6) Fifth Embodiment

A sputtering apparatus according to the fifth embodiment of the present invention will be explained next. Similar reference numerals will be provided to components similar to the third embodiment, and detailed explanation will be omitted. For a sputtering apparatus according to this embodiment, a configuration of the cathodes is different from that of the third embodiment.

Figure 15:
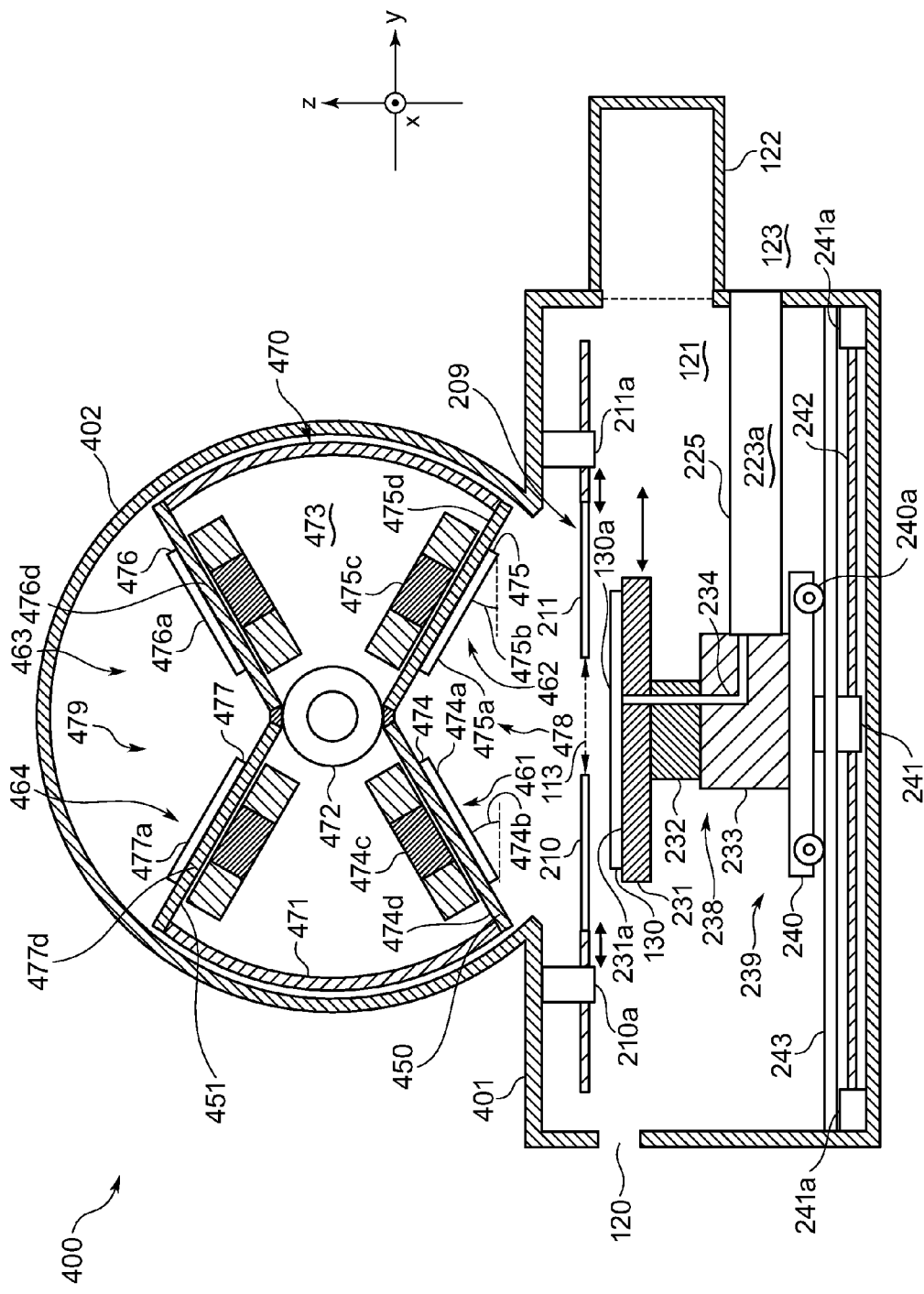
FIG. 15 is a vertical cross-sectional view showing an entire configuration of a sputtering apparatus according to the fifth embodiment of the present invention.

As illustrated in FIG. 15, a sputtering apparatus 400 includes a target assembly 470 and a substrate holder 231 in a vacuum chamber 401. The substrate holder 231 is provided so as to be movable in a linear manner in the vacuum chamber 401.

The vacuum chamber 401 is formed with an approximately cylindrical lid 402 that holds a target assembly 470. The target assembly 470 includes a main assembly body 471, a first target pair 478, a second target pair 479, and a central hub 472 about which the main assembly body 471 may be rotated. A mask assembly 209 is provided and disposed between the lid 402 and the substrate holder 231.

The main assembly body 471 is formed of cylindrical shell segments, two symmetrically V-shaped target holding surfaces 450, 451, and cover plates (unillustrated) on either end to separate space 473 from space 121. The first target pair 478 is provided on the target holding surfaces 450 and the second target pair 479 is provided on the target holding surfaces 451. The targets have a rectangular shape with the long axes parallel to each other. The long axis is arranged perpendicular to the sheet of this figure (along the x-axis). The target length is preferably longer than the diameter of the substrate 130.

The first target pair 478 has a first cathode 461 and a second cathode 462. The second target pair 479 has a third cathode 463 and a fourth cathode 464.

The first cathode 461 has a first target 474, a target holder 474d, and a magnet unit 474c disposed at the back side of the target holder 474d. The first target 474 can face a substrate 130 with a target surface 474a being tilted.

An angle 474b made by the first target surface 474a and the substrate 130 can be adjusted by a rotation about the hub 472. The magnet unit 474c is provided inside the main assembly body 473 which is preferably at atmospheric pressure. The second, third, and fourth cathodes 462, 463, 464 have a similar configuration as the first cathode 461, and thus detailed explanations will be omitted.

The first cathode 461 and the second cathode 462 are fixed on the holding surface 450 with the target surfaces 474a, 475a obliquely facing each other. The third cathode 463 and the fourth cathode 464 are fixed on the holding surface 45 with the target surfaces 476a, 477a obliquely facing each other. The targets 474, 475, 476, 477 may be formed of the same kind of material or may be made of different materials.

As explained above, according to the sputtering apparatus 400, with the mask assembly 209, the substrate cooling part 238, and the translating mechanism 239, advantages similar to the third embodiment can be obtained.

Moreover, according to the sputtering apparatus 400, by rotating the target assembly 470 around the hub 472, either the first target group 478 or the second target group 479 can be selected. In case of dissimilar targets, multilayers with may be deposited. In case of similar targets, target replacement cycles can be extended.

For the sputtering apparatus 400, in the first target group 478, the target surfaces 474a, 475a are obliquely facing each other. Hence, sputtering can be carried out from either one of the target surfaces or both of the target surfaces.

Moreover, when the assembly main body 471 is rotated by 180 degrees, the third cathode 463 and the fourth cathode 464 are fixed on the holding surface 451 with the target surfaces 476a, 477a obliquely facing each other. Hence, sputtering can be carried out from either one of the target surfaces or both of the target surfaces.

(7) Sixth Embodiment

A sputtering apparatus according to the sixth embodiment of the present invention will be explained next. Similar reference numerals will be provided to components similar to the third embodiment, and detailed explanation will be omitted. For this embodiment, the cathode configuration is different from that of the third embodiment.

Figure 16:
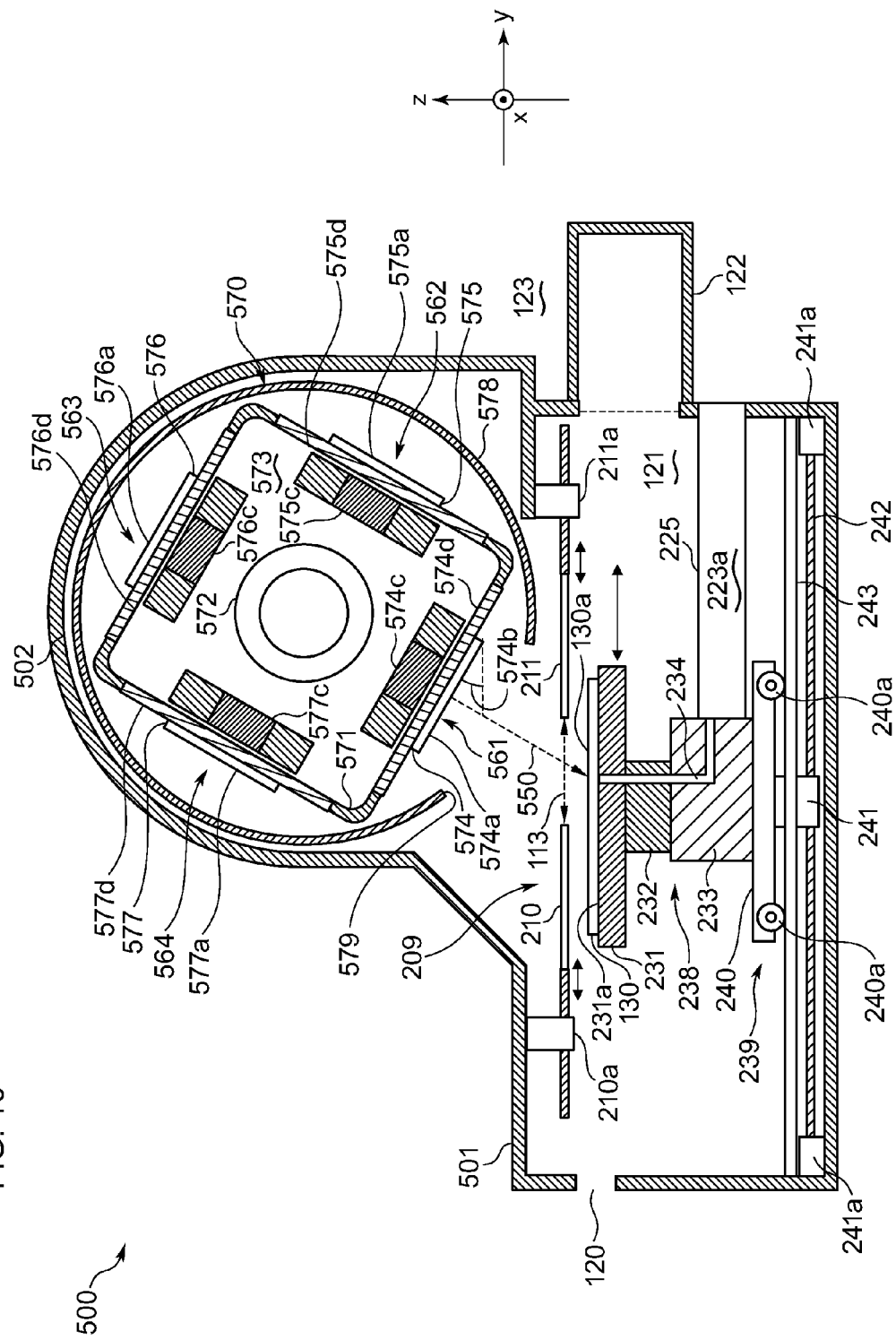
FIG. 16 is a vertical cross-sectional view showing an entire configuration of a sputtering apparatus according to the sixth embodiment of the present invention.

As illustrated in FIG. 16, a sputtering apparatus 500 includes a target assembly 570 and a substrate holder 231 in a vacuum chamber 501. The substrate holder 231 is provided so as to be movable in a linear manner in the vacuum chamber 501 by a translating mechanism 239.

The vacuum chamber 501 is formed together with an approximately cylindrical lid 502 that holds a target assembly 570. The target assembly 570 includes a main assembly body 571, a first cathode 561, a second cathode 562, a third cathode 563, a fourth cathode 564, and a hub 572 about which the main assembly body 571 may be rotated. A mask assembly 209 is attached to the chamber 501 and disposed between the lid 502 and the substrate holder 231.

The main assembly body 571 is formed of a rectangular cuboid with a substantially square cross-section. Four cathodes 561 to 564 are provided on the rectangular surfaces thereof. A drum shield 578 is provided around the main assembly body 571 and is rotatable about an axis coincident with the rotation axis of the main assembly body. The drum shield 578 is formed of a cylindrical shell segment that covers the assembly main body 571 but with an opening 579 directed to an opening 113 of a mask assembly 209.

The first cathode 561 has a first target 574, a target holder 574d, and a magnet unit 574c provided at the back side of the target holder 574d. The first target 574 can face the substrate 130 with a first target surface 574a tilted. Moreover, the first target 574 has a rectangular shape, and the long axis thereof is disposed perpendicular to the sheet of this figure (along the x-axis). The length of the long axis of the first target 574 is longer than the diameter of the substrate 130.

An angle 574b made by the first target surface 574a and the substrate 130 can be adjusted by a rotation of the main assembly body 571. The magnet unit 574c is provided inside the assembly main body 571, which is preferably at atmospheric pressure. The second, third, and fourth cathodes 562, 563, 564 are of similar configuration as the first cathode 561, and thus detailed explanations will be omitted. When the target assembly 570 is rotated with the drum shield 578 being fixed, each target surface 574a, 575a, 576a, 577a can be configured to face the substrate surface 130a.

The angle 574b made by each of the target surface 574a to 577a and the substrate 130 can be adjusted in order to deposit at a larger incidence angle. For example, it is desirable to set the angle 574b so that an incidence angle can be 30 degrees in order to increase a deposition rate of $Fe_{70}Co_{30}$ having high magnetization Ms.

For depositions at large incidence angles, the opening 113 may be configured toward the first-masking-part-210 side and the main assembly body 571 rotated in the counterclockwise direction. Furthermore, by rotating the drum shield 578 in the counterclockwise direction, sputtered particles from an erosion track on the first-masking-part-210 side of the first target surface 574a may be partially blocked.

As explained above, according to the sputtering apparatus 500, with the mask assembly 209, the substrate cooling part 238, and the translating mechanism 239, the advantages similar to the third embodiment can be obtained.

In this embodiment, although the described main assembly body 571 has a rectangular cuboid shape, other shapes are also possible. For example, the main assembly body may be formed of a rectangular prism with polygonal cross-section.

(Modification)

A sputtering apparatus according to a modification of the sixth embodiment of the present invention will be explained next. Similar reference numerals will be provided to components similar to the sixth embodiment, and the explanation will be omitted. For this embodiment, a fifth cathode is further provided to the apparatus according to the sixth embodiment.

As illustrated in FIG. 17, for a sputtering apparatus 600, a fifth cathode part 665 is provided in a vacuum chamber 601. The fifth cathode 665 is provided at the first-masking-part 210 side relative to the target assembly 570 and includes a fifth target 679, a target holder 679d, and a magnet unit 679c provided at the back side of the target holder 679d. The fifth target 679 has a fifth target surface 679a that is tilted.

(8) Modifications

The present invention is not limited to the above embodiments, and can be changed and modified within the scope of the present invention as needed. For example, according to the embodiments as described above, the magnetic layer of the magnetic writer or sensor was described for convenience, but the embodiments of the present invention is not limited to such a device. For example, a magnetic layer used for MRAM can be formed effectively.

In the case of the above embodiments, an instance was described in which the target was disposed so that the surface thereof was tilted relative to the substrate surface. However, the present invention is not limited to tilted target surfaces as long as the target surface normal line is not coincident with a normal line of a substrate surface passing through the center of the opening of the mask assembly.

Moreover, for the sputtering apparatus according to the third to sixth embodiments, the mask assembly according to the second embodiment may be applied.

In the case of the above embodiments, an instance was described in which the first masking part and the second masking part which construct the mask assembly are movable in parallel to the substrate surface. However, the present invention is not limited. The first masking part and the second masking part may be provided so as to be movable perpendicular to the substrate receiving surface (in the z-axis direction).

What is claimed is:
1. A sputtering apparatus for forming a magnetic layer on a substrate, comprising:
a vacuum enclosure;
a cylindrical rotatable target assembly including a hollow main body including a shell, a plurality of elongated targets and a plurality of target holders equidistantly disposed from a central rotation axis of the cylindrical rotatable target assembly, each of the plurality of target holders including a corresponding one of the plurality of targets, the plurality of target holders including a first target holder including a first target of the plurality of the targets, the first target including a short axis and a long axis, wherein the central rotation axis of the cylindrical rotatable target assembly is parallel to the long axis of the first target, and wherein the plurality of targets are disposed on an outer surface of the shell of the hollow main body;
a substrate holder comprising a substrate receiving surface;
a translating mechanism that moves the substrate holder or the first target holder along a direction substantially parallel to the substrate receiving surface and perpendicular to the long axis of the first target; and
a mask assembly formed with an opening between the first target holder and the substrate holder, wherein said mask assembly comprises a first masking part and a second masking part which are disposed substantially parallel to the substrate receiving surface,
said opening being formed between facing edges of the first masking part and the second masking part,
wherein the cylindrical rotatable target assembly is rotated so as to configure at least one of the targets to face toward the opening of the mask assembly,
said first masking part and second masking part being independently movable in a direction substantially perpendicular to the long axis of the first target and substantially parallel to the substrate receiving surface, or in a direction which is substantially perpendicular to the substrate receiving surface,
wherein the plurality of target holders of the cylindrical rotatable target assembly form at least a first and a second pair of two obliquely-facing target holders, the two obliquely-facing target holders obliquely facing to each other, such that the cylindrical rotatable target assembly is rotated to configure two targets of one of the first and the second pair of the two obliquely-facing target holders to face the opening of the mask assembly, said first and second pair of target holders being arranged radially opposite to each other, wherein the first pair of the two obliquely-facing target holders constitutes a first target holding surface having a V-shape in cross section and the second pair of the two obliquely-facing target holders constitutes a second target holding surface having an inverted V-shape in cross section, and wherein the plurality of the target holders further includes a second target holder including a second target of the plurality of the targets wherein, said first target holder is provided so that a normal line of a surface thereof is tilted by an angle between 15 degrees to 45 degrees relative to a normal line of said substrate receiving surface passing through said opening of the mask assembly, and said second target holder is provided so that a normal line of a surface thereof is tilted by an angle between −15 degrees to −45 degrees relative to the normal line of said substrate receiving surface.

2. The sputtering apparatus according to claim 1, wherein the mask assembly comprises a center masking part which reduces a width of a central part of the opening of the mask assembly.

3. The sputtering apparatus according to claim 1, wherein the mask assembly has a floating potential.

4. The apparatus according to claim 1, wherein the cylindrical rotatable target assembly further includes a plurality of magnet units each disposed adjacent to corresponding one of the plurality of target holders.

5. The apparatus according to claim 4, wherein the plurality of magnet units are disposed on an inner surface of the shell of the hollow main body.

6. The apparatus according to claim 5, wherein an inside of the hollow main body is substantially at atmospheric pressure.

7. The apparatus according to claim 1, wherein the first and the second pair of the two obliquely-facing target holders are each a part of the shell of the hollow main body.

8. The apparatus according to claim 1, wherein the plurality of target holders are each a part of the shell of the hollow main body.

9. The apparatus according to claim 8, wherein the cylindrical rotatable target assembly further includes a plurality of magnet units each disposed adjacent to corresponding one of the plurality of target holders, and wherein the plurality of magnet units are disposed on an inner surface of the shell.

10. The apparatus according to claim 1, wherein the hollow main body has a rectangular shape in cross section.

11. The apparatus according to claim 1, wherein the vacuum enclosure includes a cylindrical lid containing the cylindrical rotatable target assembly, wherein the cylindrical lid has an arc shape in cross section.

12. The apparatus according to claim 11, wherein the shell of the hollow main body includes a segment having an arc shape in cross section.

13. The apparatus according to claim 11, wherein the cylindrical lid includes a drum shield surrounding the cylindrical rotatable target assembly.

14. The apparatus according to claim 13, wherein the hollow main body has a rectangular shape in cross section.

15. The apparatus according to claim 2, wherein the center masking part is independently movable from the first masking part and the second masking part.

16. The apparatus according to claim 15, wherein the center masking part includes a second opening.

17. The apparatus according to claim 15, wherein the center masking part includes a first center masking part and a second center masking opposite to each other.

* * * * *